(12) United States Patent
Ahmed et al.

(10) Patent No.: US 7,091,068 B1
(45) Date of Patent: Aug. 15, 2006

(54) PLANARIZING SACRIFICIAL OXIDE TO IMPROVE GATE CRITICAL DIMENSION IN SEMICONDUCTOR DEVICES

(75) Inventors: Shibly S. Ahmed, San Jose, CA (US); Cyrus E. Tabery, Sunnyvale, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 310 days.

(21) Appl. No.: 10/310,776

(22) Filed: Dec. 6, 2002

(51) Int. Cl.
*H01L 21/00* (2006.01)

(52) U.S. Cl. ............ 438/149; 438/164; 438/151

(58) Field of Classification Search ........ 438/149, 438/164, 151
See application file for complete search history.

(56) References Cited

U.S. PATENT DOCUMENTS

| | | | |
|---|---|---|---|
| 6,611,029 B1 * | 8/2003 | Ahmed et al. | 257/365 |
| 6,686,231 B1 * | 2/2004 | Ahmed et al. | 438/164 |
| 6,756,643 B1 * | 6/2004 | Achuthan et al. | 257/365 |
| 6,787,439 B1 * | 9/2004 | Ahmed et al. | 438/585 |
| 6,800,885 B1 * | 10/2004 | An et al. | 257/275 |
| 6,800,910 B1 * | 10/2004 | Lin et al. | 257/410 |
| 6,803,631 B1 * | 10/2004 | Dakshina-Murthy et al. | 257/349 |
| 6,812,076 B1 * | 11/2004 | Achuthan et al. | 438/157 |
| 6,815,268 B1 * | 11/2004 | Yu et al. | 438/149 |
| 6,933,219 B1 * | 8/2005 | Lingunis et al. | 438/593 |
| 6,982,464 B1 * | 1/2006 | Achuthan et al. | 257/368 |
| 7,001,837 B1 * | 2/2006 | Ngo et al. | 438/634 |
| 7,029,959 B1 * | 4/2006 | Yang et al. | 438/164 |
| 2004/0126975 A1 * | 7/2004 | Ahmed et al. | 438/283 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFet," IEEE Transactions on Electron Devices, vol. 48, No. 5, May 2001, pp. 880-886.
Xuejue Huang et al., "Sub 50-nm FinFet: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—Laura M. Schillinger
(74) *Attorney, Agent, or Firm*—Harrity Snyder, LLP

(57) ABSTRACT

A method of manufacturing a semiconductor device may include forming a fin structure on an insulator and depositing a gate material over the fin structure. The method may also include forming a sacrificial material over the gate material and planarizing the sacrificial material. An antireflective coating may be deposited on the planarized sacrificial material. A gate structure may then be formed by etching the gate material.

10 Claims, 10 Drawing Sheets

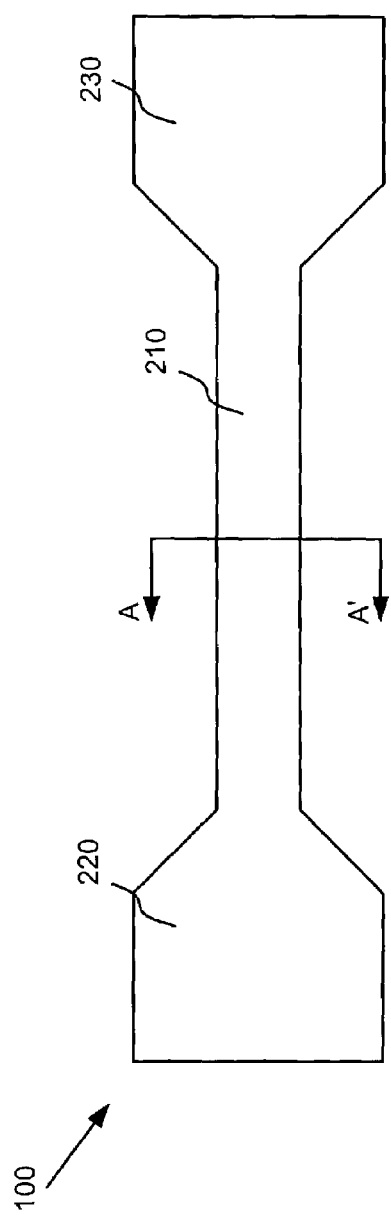
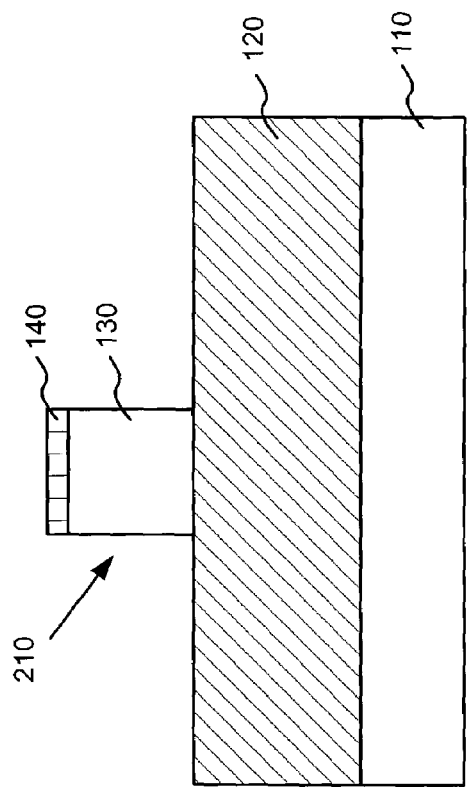

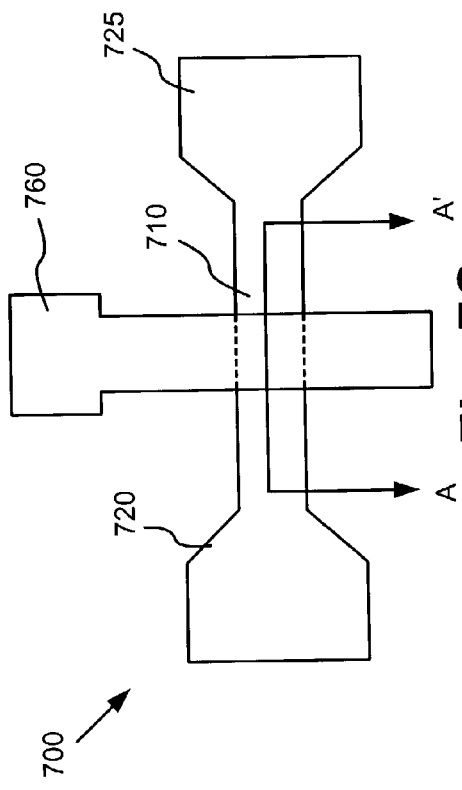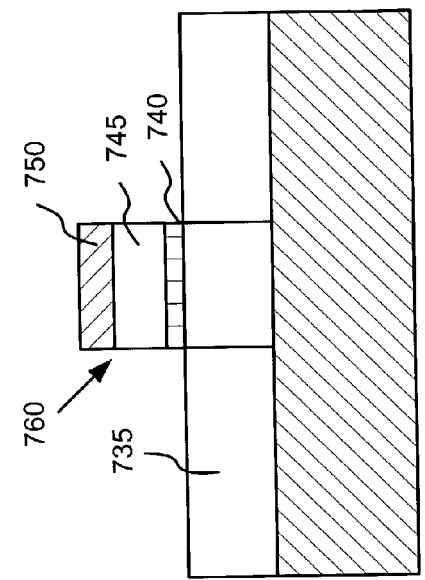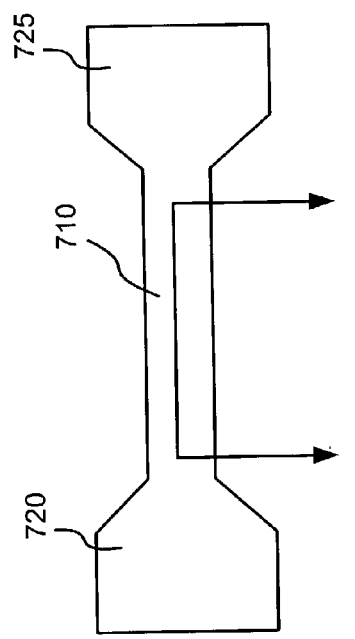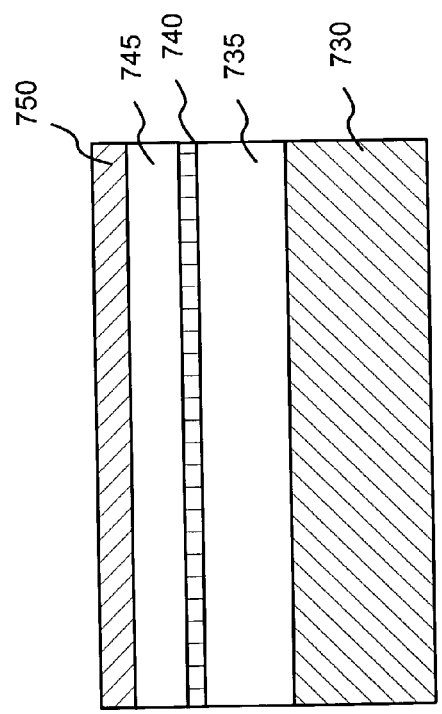

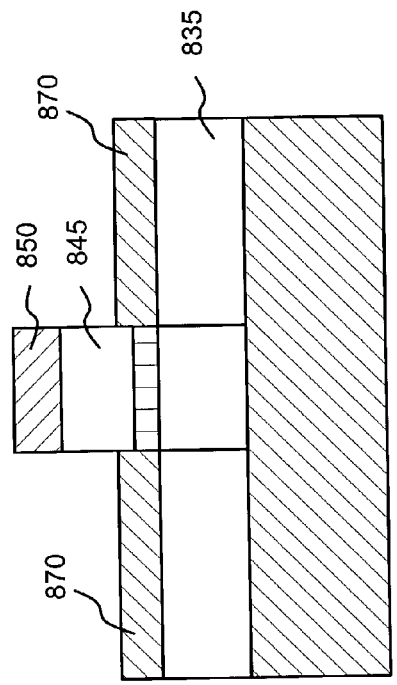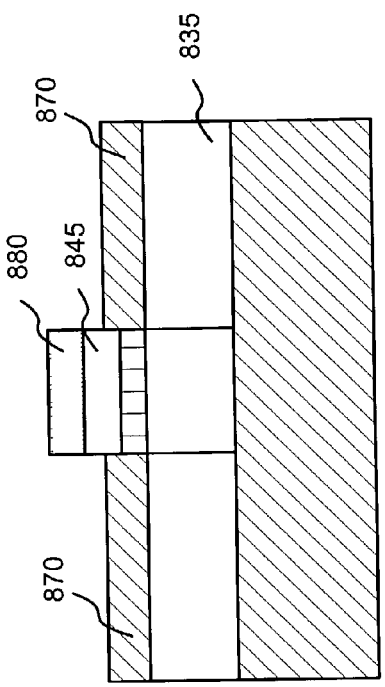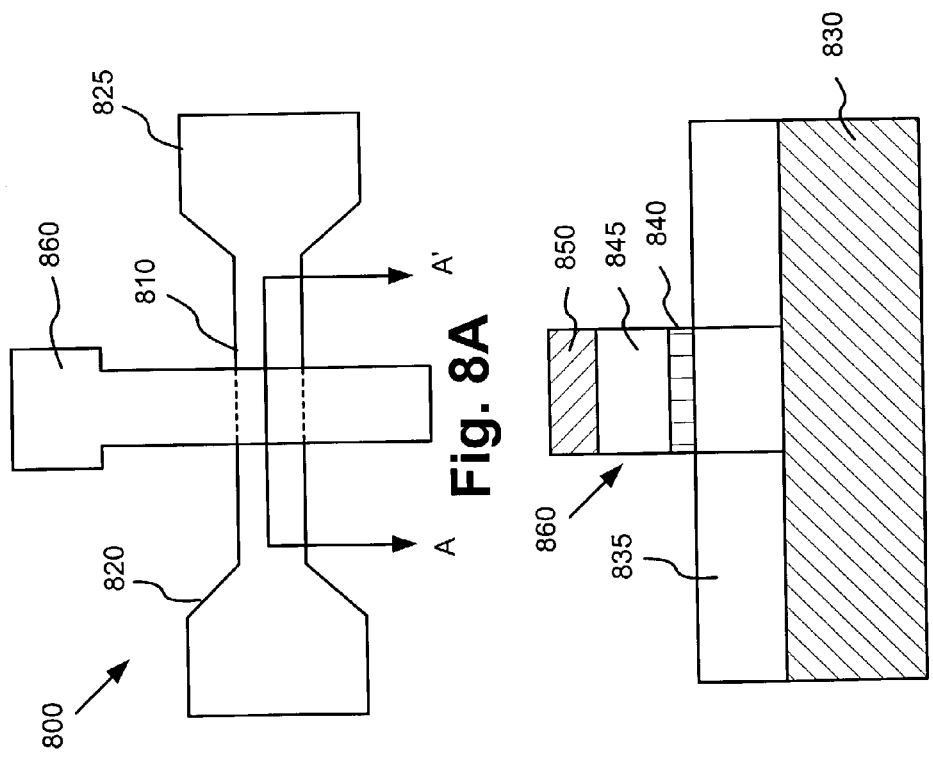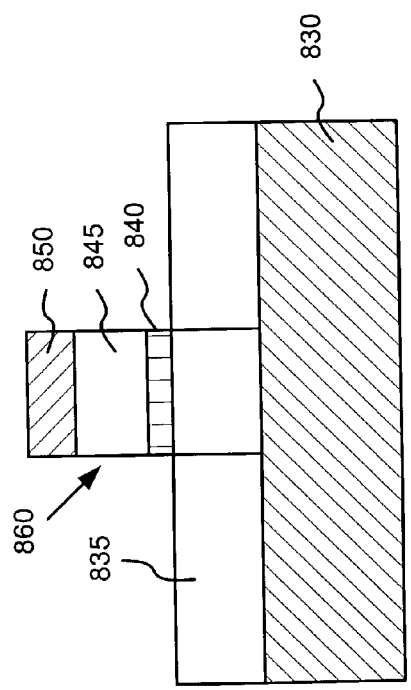

PLANARIZING SACRIFICIAL OXIDE TO IMPROVE GATE CRITICAL DIMENSION IN SEMICONDUCTOR DEVICES

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a method of forming a FinFET device that improves a critical dimension (CD) of the gate. A sacrificial layer formed over the gate material may be planarized before gate patterning. In addition, an antireflective coating may be formed on the planarized sacrificial layer.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a method of manufacturing a semiconductor device including forming a fin structure on an insulator and depositing a gate material over the fin structure. The method may also include forming a sacrificial material over the gate material and planarizing the sacrificial material. An antireflective coating may be deposited on the planarized sacrificial material. A gate structure may be formed from the gate material.

According to another aspect of the invention, a method of manufacturing a semiconductor device may include forming a fin structure on an insulator and depositing polysilicon over the fin structure. The method may also include forming an oxide layer over the polysilicon and polishing the oxide layer to obtain a planar top surface. An antireflective layer may be deposited on the planar top surface of the oxide layer. A gate structure may be formed from the polysilicon.

According to a further aspect of the invention, a method of manufacturing a semiconductor device may include forming a fin structure on an insulator and depositing polysilicon over the fin structure. The method may also include forming a dielectric over the polysilicon and polishing the dielectric to obtain a planar top surface. The method may further include depositing an antireflective coating on the planar top surface of the dielectric and depositing a photoresist layer over the antireflective coating. The photoresist layer may be patterned to define a gate structure. The dielectric and polysilicon may be etched to form at least one gate.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

FIG. 2A schematically illustrates the top view of a fin structure in accordance with an exemplary embodiment of the present invention.

FIG. 2B is a cross-section illustrating the formation of the fin structure of FIG. 2A in accordance with an exemplary embodiment of the present invention.

FIGS. 7A–7F are top and cross-sectional views illustrating differential siliciding of a source/drain and gate in a FinFET in accordance with another implementation of the present invention.

FIGS. 8A–8E are top and cross-sectional views illustrating full siliciding of a gate in a FinFET in accordance with another implementation of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a method of forming a FinFET device that improves a smallest feature size in the gate. To improve the smallest feature size, the gate material may be planarized before gate patterning. In addition, an antireflective coating may be formed on the planarized gate material.

Figure 1:
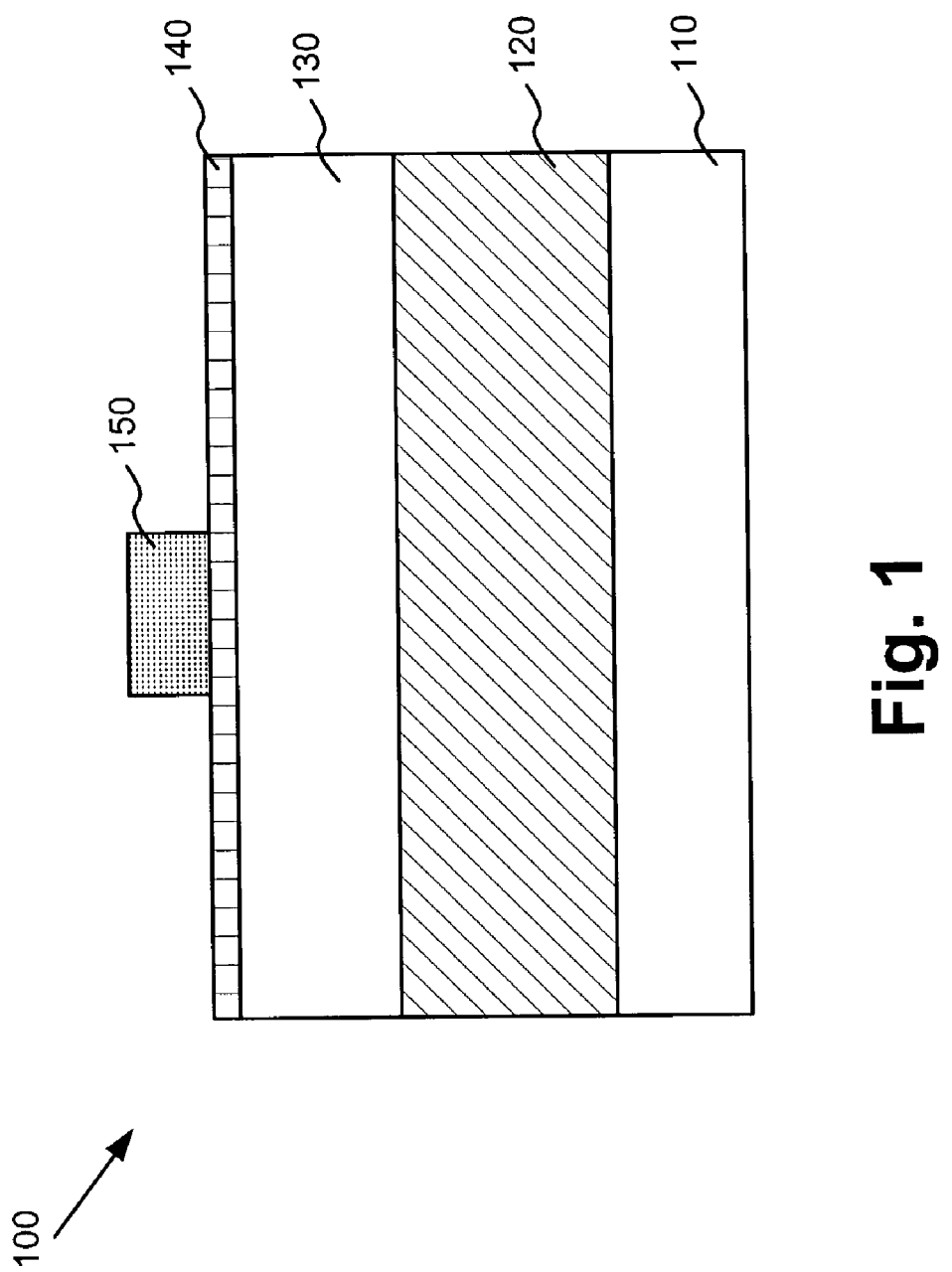
FIG. 1 is a cross-section illustrating exemplary layers that may be used for forming a fin in accordance with an embodiment of the present invention.

FIG. 1 illustrates the cross-section of a semiconductor device 100 formed in accordance with an exemplary embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be deposited at a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions.

FIG. 2A schematically illustrates the top view of a fin structure on semiconductor 100 formed in such a manner. Source region 220 and drain region 230 may be formed adjacent to and at the ends of fin 210 on buried oxide layer 120, according to an exemplary embodiment of the present invention.

FIG. 2B is a cross-section along line A–A' in FIG. 2A illustrating the formation of fin structure 210 in accordance with an exemplary embodiment of the present invention. As described above, dielectric layer 140 and silicon layer 130 may be etched to define fin 210. Fin 210 may be formed out of silicon 130.

Figure 3:
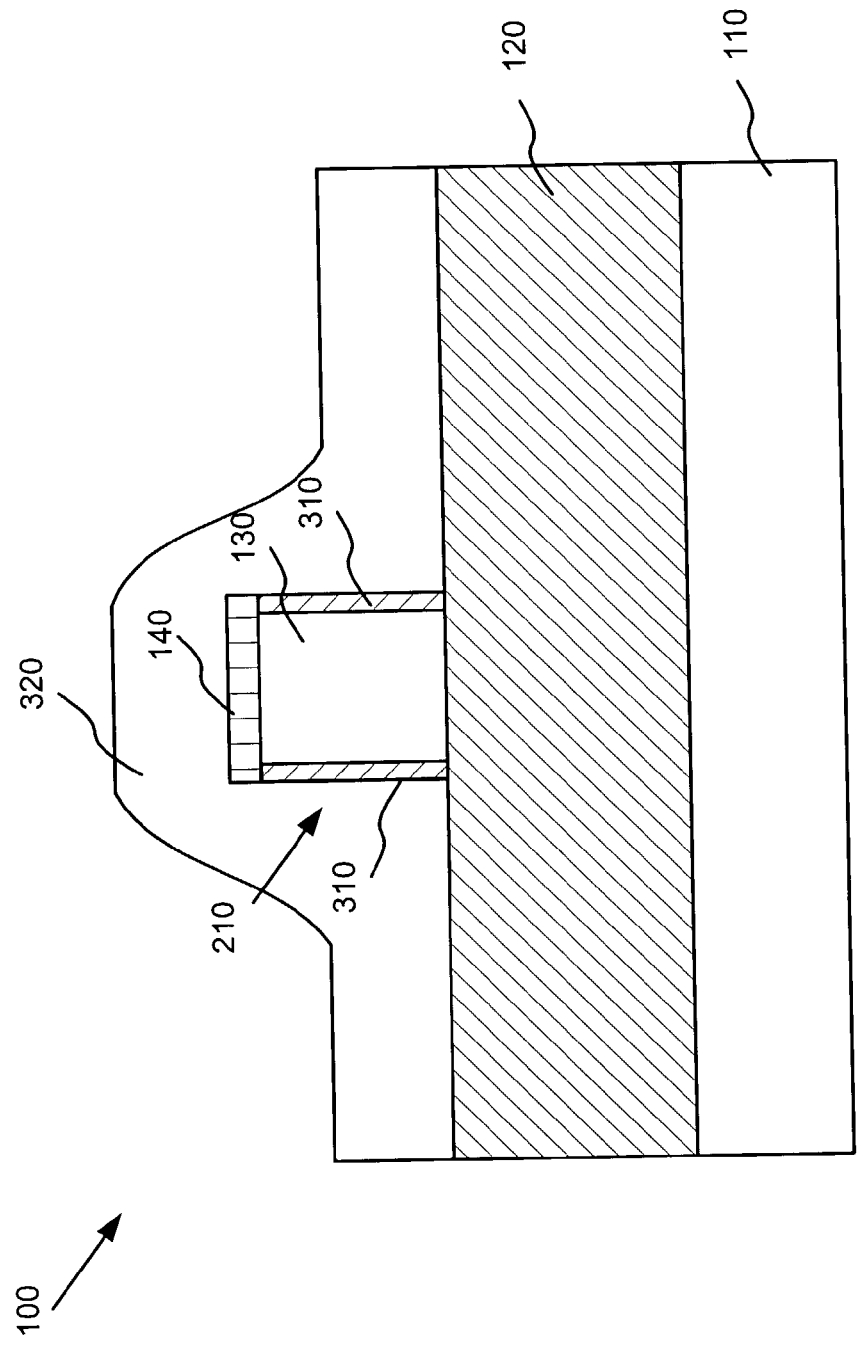
FIG. 3 is a cross-section illustrating the formation of a gate dielectric layer and gate material on the device of FIG. 2B in accordance with an exemplary embodiment of the present invention.

FIG. 3 is a cross-section illustrating the formation of a gate dielectric layer and gate material on fin 210 in accordance with an exemplary embodiment of the present invention. A dielectric layer may be formed on fin 210. For example, a thin oxide film 310 may be thermally grown on fin 210, as illustrated in FIG. 3. The oxide film 310 may be grown to a thickness of about 10 Å to about 50 Å and may be formed on the exposed side surfaces of silicon 130 in fin 210 to act as a dielectric layer for a subsequently formed gate electrode. Similar to the oxide film 310, the dielectric cap 140 may provide electrical insulation for the top surface of fin 210.

In another implementation consistent with the principles of the invention, the dielectric layer 140 may not be used, and oxide film 310 may be grown on the top surface of fin 210, in addition to the side surfaces. In such an implementation, oxide film 310 may provide electrical insulation on all exposed surfaces of fin 210.

A gate material layer 320 may be deposited over semiconductor device 100 after formation of the oxide film 310. The gate material layer 320 may include the material for the subsequently formed gate electrode. In an exemplary implementation, the gate material layer 320 may include polysilicon deposited using conventional chemical vapor deposition (CVD) or other well known techniques. Alternatively, other semiconducting materials, such as germanium or combinations of silicon and germanium, or various metals may be used as the gate material.

In one implementation, gate material layer 320 may be deposited to a uniform thickness around fin 210. Such a uniform thickness may range from about 300 Å to about 700 Å. In another implementation, gate material layer 320 may be deposited in a relatively thin layer (e.g., around the lower end of the above thickness range) to facilitate full siliciding in later processing to create a metal gate.

Figure 4:
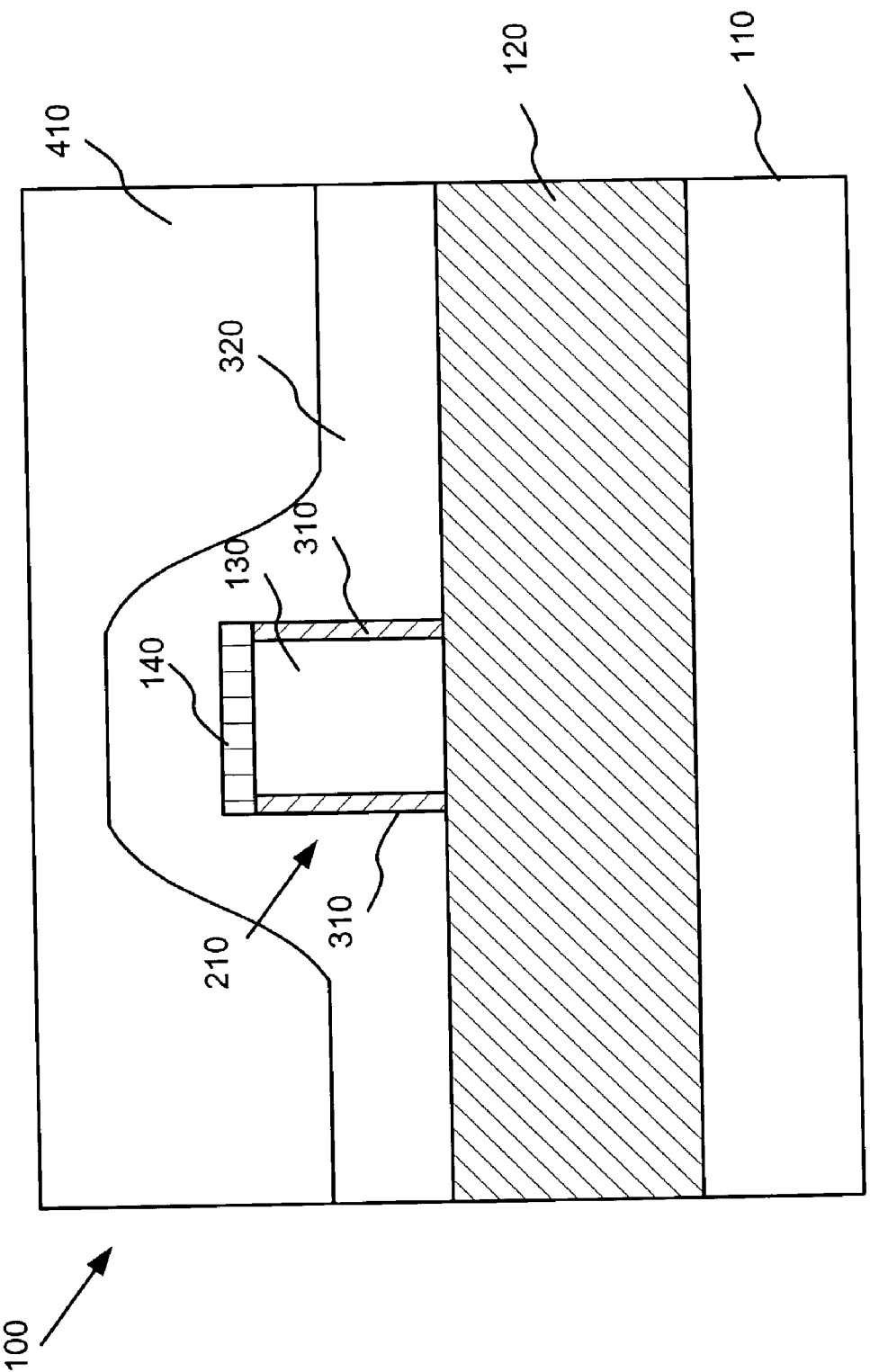
FIG. 4 is a cross-section illustrating the deposition and planarizing of an oxide layer on the device of FIG. 3 in accordance with an exemplary embodiment of the present invention.

FIG. 4 is a cross-section illustrating the deposition and planarizing of an oxide layer on the semiconductor device 100 of FIG. 3 in accordance with an exemplary embodiment of the present invention. A relatively thick layer of oxide material such as $SiO_2$ may be deposited (e.g., by LPCVD or PECVD deposition techniques) over gate material layer 320 to form oxide layer 410, which may also be referred to as sacrificial oxide layer 410. Chemical-mechanical polishing (CMP) or other conventional technique may be performed so that the upper surface of oxide layer 410 is substantially planar as shown in FIG. 4. A thickness of the sacrificial oxide layer 410 after planarizing may range from about 1000 Å to about 2000 Å over the field region. Although the layer 410 has been described as including an oxide material, those skilled in the art will appreciate that other materials 410 may be used for this sacrificial layer 410.

In an alternative implementation, a thicker gate material layer 310 may be deposited and then polished back to create a planar top surface similar to that shown in FIG. 4. In FinFET devices, however, the width of the channel corresponds to the vertical height of silicon layer 130 in fin 210. Hence, a thicker gate material layer 320 may create, for example, a non-uniform polysilicon thickness for different portions of the channel. Thus, by depositing (and planarizing) the oxide layer 410, the thickness of gate material layer 320 may be made the same over the whole channel region of fin 210.

Further, the oxide layer 410 permits deposition of a relatively thin gate material layer 320 (e.g., polysilicon), while still allowing a planar top surface for later processing. Such a relatively thin gate material layer 320 may be as thin as about 300 Å. The thin gate material layer 320 may facilitate full siliciding in later processing to create a metal gate.

Figure 5:
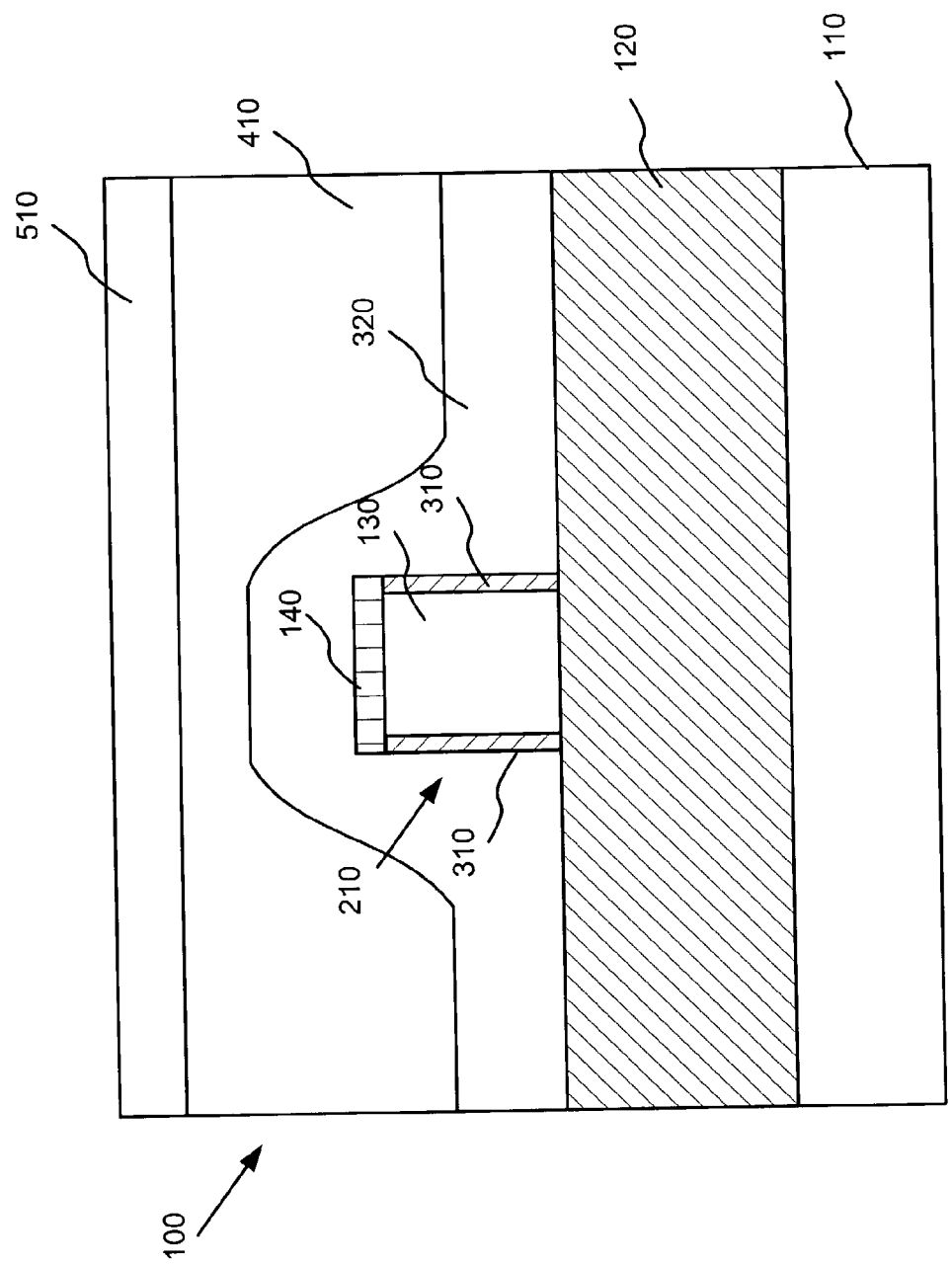
FIG. 5 is a cross-section illustrating the deposition of an antireflective coating on the device of FIG. 4 in accordance with an exemplary embodiment of the present invention.

FIG. 5 is a cross-section illustrating the deposition of an antireflective coating on the semiconductor device 100 in accordance with an exemplary embodiment of the present invention. A bottom antireflective coating (BARC) layer 510 may be deposited on (e.g., spun on) the oxide layer 410. The oxide layer 410 may provide at least a planar bottom surface for BARC layer 510, and may tend to flatten the top surface of BARC layer 510. BARC layer 510 may have a thickness ranging from about 100 Å to about 500 Å.

Figure 6:
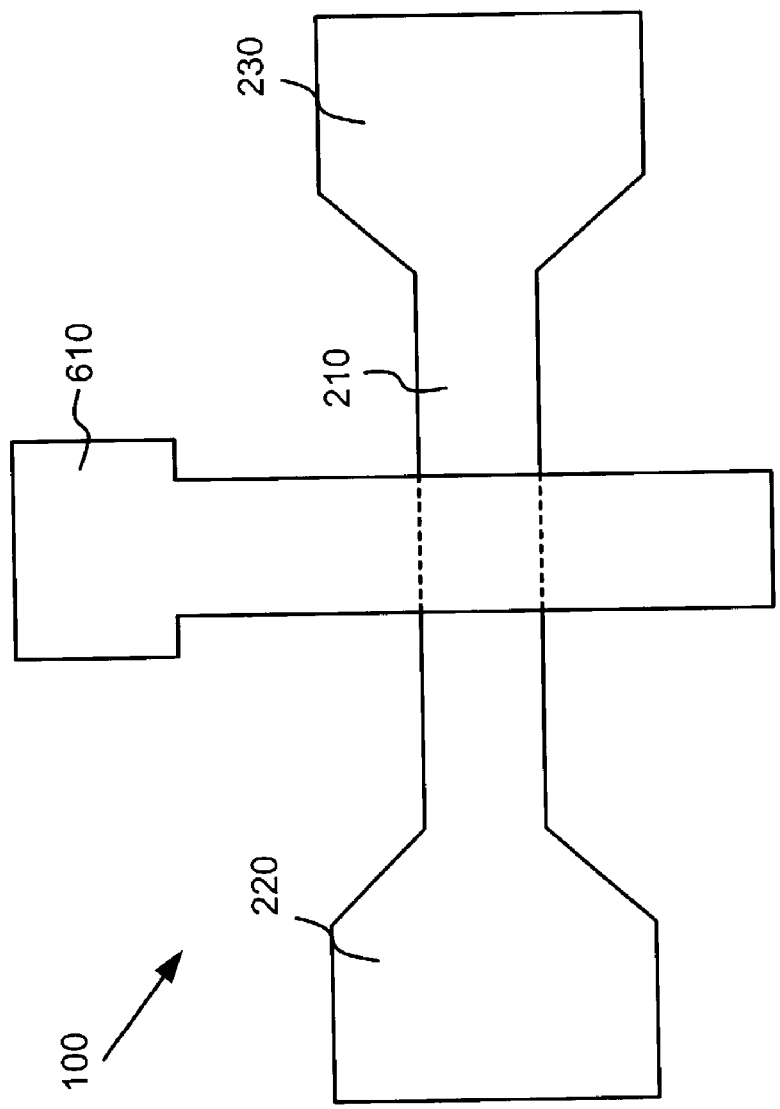
FIG. 6 schematically illustrates the top view of a FinFET structure in accordance with an exemplary embodiment of the present invention.

FIG. 6 schematically illustrates the top view of semiconductor device 100 in accordance with an exemplary embodiment of the present invention. As illustrated, a gate structure 610 may be patterned to extend across a channel region of the fin 210. Gate structure 610 may include a gate portion proximate to the sides of the fin 210 and a larger electrode portion spaced apart from the fin 210. The electrode portion of gate structure 610 may provide an accessible electrical contact for biasing or otherwise controlling the gate portion.

Gate structure 610 may be defined in the gate material layer 320 by lithography (e.g., photolithography). As will be understood by those skilled in the semiconductor art, photoresist may be deposited on the BARC layer 510 and patterned in the shape of gate structure 610. Both oxide layer 410 and gate material layer 320 may then be selectively etched to form the gate structure 610 on device 100. After the etching, the remaining oxide layer 410 may be removed, for example, by wet etching. Such removal of oxide layer 410 may leave only gate material layer 320 to form the gate structure 610.

Because of the planar oxide layer 410, the photoresist over the BARC layer 510 may be patterned more precisely, and the gate structure 610's critical dimension (CD) (i.e., its smallest feature size) may be improved. For example, gate CDs in a range from about 20 nm to about 50 nm may be achieved due to the planarizing of oxide layer 410 by CMP. Thus, a planar top surface of oxide layer 410, as opposed to the highly non-planar surface of gate material layer 320 during typical FinFET gate definition, may improve the CD of gate structure 610.

Although the above process has been described with respect to a thermally grown oxide 310 as the gate dielectric and a polysilicon gate material 320, it is equally applicable when other materials are used for the gate dielectric and gate material. For example, a high k dielectric material (e.g., k greater than about 3.9) may be used as the gate dielectric. Also, a metal material may be used as the gate material 320 in the above-described process.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

Thus, in accordance with the present invention, the gate CD in a double-gate FinFET device is improved by planarizing oxide layer 410 prior to depositing BARC layer 510 and defining the gate. Advantageously, the resulting structure exhibits good short channel behavior. In addition, the present invention provides increased flexibility and can be easily integrated into conventional processing.

OTHER IMPLEMENTATIONS

Figure 7F:
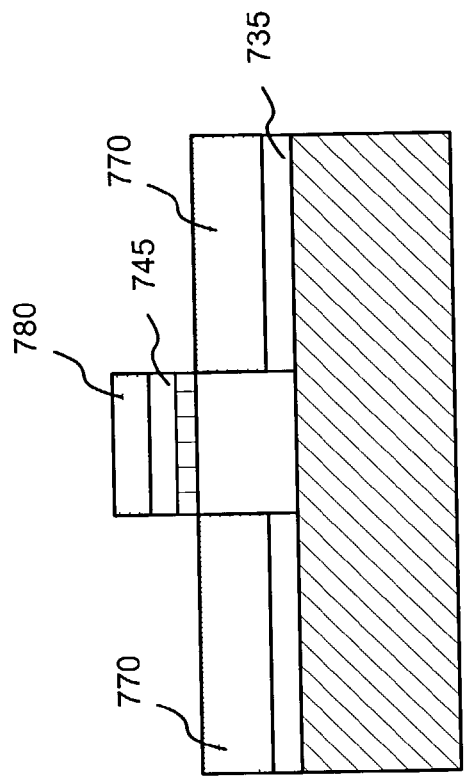

In some implementations, it may be desirable to differentially suicide a source/drain and gate in a FinFET. FIGS. 7A–7F are top and cross-sectional views illustrating differential siliciding of a source/drain and gate in a FinFET in accordance with another implementation of the present invention. FIG. 7A shows a top view of a fin structure including a fin 710, a source region 720, and a drain region 725. The structure shown in FIG. 7A may be formed on a silicon on insulator structure. FIG. 7B shows a cross-section of the structure in FIG. 7A taken along line A–A'. Silicon layer 735 on oxide layer 730 may be patterned to form the fin structure in FIG. 7A. Next, gate oxide layer 740 may be grown over the silicon layer 735, and gate material layer 745 (such as polysilicon) may be deposited on the gate oxide layer 740. Then a nitride layer 750 may be deposited on the gate material layer 745.

FIG. 7C shows a top view of a FinFET 700. Gate oxide layer 740, gate material layer 745, and nitride layer 750 may be patterned and etched to form gate structure 760, which extends over fin 710 in a channel region. An oxide sidewall spacer may be deposited. FIG. 7D is a cross-sectional view along line A–A' in FIG. 7C. As illustrated in FIG. 7D, on either side of gate structure 760 are a source region of silicon layer 735 and a drain region of silicon layer 735.

Figure 7E:
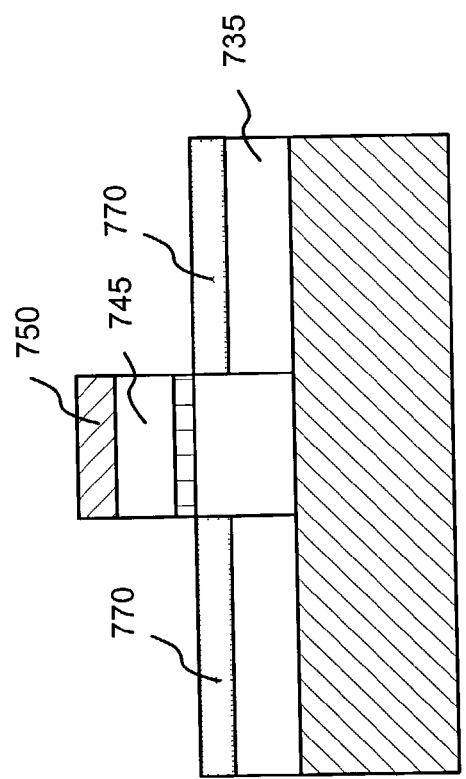

As shown in FIG. 7E, the source region and drain region of silicon layer 735 (i.e., fin 710) may be silicided to form respective silicide regions 770. Nitride cap 750 and sidewall spacer prevents gate material 745 (e.g., polysilicon) from being silicided. Then the nitride cap shown in FIG. 7E may be removed, and the device may be silicided a second time. FIG. 7F illustrates deeper suicide regions 770 in the source and drain regions from this second siliciding process. A relatively shallower gate silicide region 780 in the gate structure 760 may be created by the second siliciding process. Some gate material 745 may remain under the gate silicide region 780. In this manner, the source/drain of FinFET 700 may be differentially silicided from the gate.

Figure 8E:
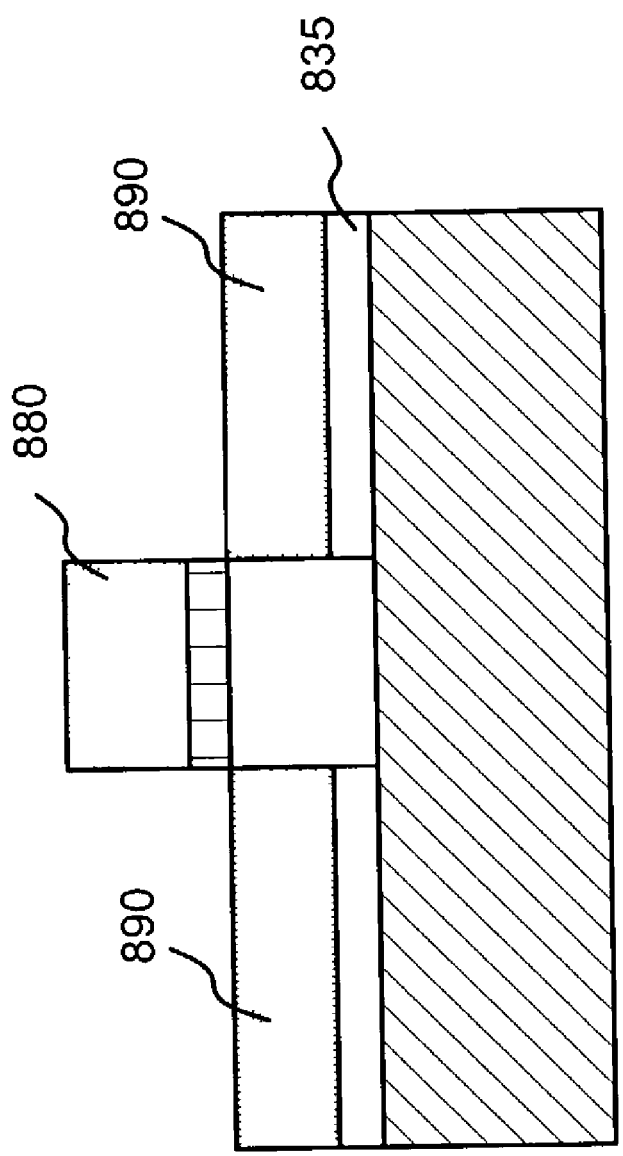

In other implementations, a FinFET with a fully silicided gate may be desired. FIGS. 8A–8E are top and cross-sectional views illustrating full siliciding of a gate in a FinFET in accordance with another implementation of the present invention. FIG. 8A shows a top view of a FinFET 800. Through a process similar to that described above for FIGS. 7A–7C, FinFET 800 may be formed, including a fin 810, a source region 820, a drain region 825, and a gate structure 860. FIG. 8B shows a cross-section of the structure in FIG. 8A taken along line A–A'. Gate structure 860 may include a gate oxide 840, gate material 845 (e.g., polysilicon), and a nitride cap 850. Gate structure 860 may be formed over silicon layer 835 (i.e., fin 810), which in turn in formed on an insulator 830 (e.g., a buried oxide). As illustrated in FIG. 8C, on either side of gate structure 860 are a source region of silicon layer 835 and a drain region of silicon layer 835.

As also shown in FIG. 8C, a liner oxide 870 may be grown or deposited over the source portion and drain region of silicon layer 835. Then nitride cap 850 may be removed, and the FinFET 800 may undergo silicidation. As illustrated in FIG. 8D, gate silicide region 880 in the gate structure 860 may be created by this siliciding process. Some gate material 845 may remain under the gate silicide region 880. Liner oxide 870 prevents silicon layer 835 from being silicided at this point.

Next, liner oxide 870 may be removed, and a second siliciding process may occur. As shown in FIG. 8E, the resulting gate silicide region 880 may encompass all material above gate oxide 840. In other words, the gate of FinFET 800 may be fully silicided. The second siliciding process may also form source and drain silicide regions 890 in the source and drain regions, which may be shallower than gate silicide region 880. Some silicon material 835 may remain under the source and drain silicide regions 890. In this manner, the gate of FinFET 800 may be fully silicided and the source and drain regions may be partially silicided.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method of manufacturing a semiconductor device, comprising:
    forming a fin structure on an insulator;
    depositing a gate material over the fin structure;
    forming a sacrificial material over the gate material, wherein the sacrificial material includes an oxide;
    planarizing the sacrificial material;
    depositing an antireflective coating on the planarized sacrificial material; and
    forming a gate structure from the gate material.

2. The method of claim 1, wherein the forming a fin structure includes:
    depositing a dielectric layer on a silicon layer, and
    etching the dielectric layer and the silicon layer to define the fin structure, the fin structure including a silicon portion and a dielectric cap.

3. The method of claim 1, wherein the depositing a gate material includes:
    depositing polysilicon over the fin structure.

4. The method of claim 3, wherein the depositing a gate material further includes:
    depositing the polysilicon with a uniform thickness around the fin structure.

5. The method of claim 1, wherein the forming a sacrificial material includes:
    forming an oxide layer over the gate material.

6. The method of claim 1, wherein the planarizing includes:
    polishing a top surface of the sacrificial material by chemical mechanical polishing.

7. The method of claim 1, wherein the forming a gate structure includes:
    depositing a photoresist layer over the antireflective coating, and
    patterning the photoresist layer to define the gate structure.

8. The method of claim 7, wherein the forming a gate structure further includes:
    selectively etching the photoresist layer, the sacrificial material, and the gate material to form the gate structure.

9. The method of claim 1, further comprising:
    removing the sacrificial material remaining on the gate structure.

10. The method of claim 1, wherein a smallest feature size of the gate structure is less than or equal to about 50 nm.

* * * * *